US008287288B2

(12) United States Patent
Chang et al.

(10) Patent No.: US 8,287,288 B2
(45) Date of Patent: Oct. 16, 2012

(54) LOW PROFILE ELECTRICAL CONNECTOR EMBEDDED WITH PRINTED CIRCUIT BOARD

(75) Inventors: Yen-Chih Chang, Tu-Cheng (TW); Chih-Pi Cheng, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 151 days.

(21) Appl. No.: 12/944,751

(22) Filed: Nov. 12, 2010

(65) Prior Publication Data

US 2011/0111616 A1    May 12, 2011

(30) Foreign Application Priority Data

Nov. 12, 2009   (TW) ................................ 98220964 U

(51) Int. Cl.
*H01R 12/00*    (2006.01)

(52) U.S. Cl. ......................................... 439/66

(58) Field of Classification Search .................... 439/66, 439/329–331, 626, 884, 82
See application file for complete search history.

(56) References Cited

U.S. PATENT DOCUMENTS

| 5,074,798 | A | * | 12/1991 | Carter | 439/72 |
| 7,001,197 | B2 | | 2/2006 | Shirai et al. | |
| 7,497,696 | B2 | * | 3/2009 | Martinson et al. | 439/71 |
| 7,950,932 | B2 | * | 5/2011 | Fan | 439/82 |
| 8,075,327 | B2 | * | 12/2011 | Zhou et al. | 439/248 |
| 8,096,836 | B2 | * | 1/2012 | Cheng et al. | 439/626 |
| 8,144,469 | B2 | * | 3/2012 | Kyle et al. | 361/704 |

* cited by examiner

*Primary Examiner* — Jean F Duverne
(74) *Attorney, Agent, or Firm* — Wei Te Chung; Ming Chieh Chang

(57) ABSTRACT

An electrical connector assembly includes a printed circuit board having an aperture and an electrical connector. The electrical connector comprises an insulative substrate with a plurality of contacts. The electrical connector is embedded in the aperture and electrically connects with the printed circuit board.

9 Claims, 5 Drawing Sheets

LOW PROFILE ELECTRICAL CONNECTOR EMBEDDED WITH PRINTED CIRCUIT BOARD

BACKGROUND OF THE INVENTION

1. Field of the Invention

The present invention relates to an interconnection system, and more particularly, to an interconnection system in which a socket connector is properly seated within a recessed area of a substrate such that an ultra-low profile of an interconnection system can be conveniently achieved.

2. Description of Related Art

U.S. Pat. No. 7,001,197 issued to Shirai on Feb. 21, 2006 discloses a typical electrical connector comprising an insulative housing with a plurality of contacts. The insulative housing has a top surface for receiving a land grid array package. A cover member is pivotally mounted on a first end of the insulative housing. The cover member is rotatable between an open position and a closed position where the cover member presses the land grid array package toward the top surface of the insulative housing so that the land grid array package electrically connects to the contacts. A lever is pivotally mounted on a second end of the insulative housing. The lever has a locking portion for locking the cover member in the closed position. A metallic reinforcing plate is positioned on a bottom surface of the housing. The metallic reinforcing plate extends between the first end and the second end of the insulative housing. The electrical connector is soldered upon a printed circuit board by solder balls disposed on bottom surfaces of the contacts so that the printed circuit board electrically connects to the contacts.

Basically, all conventional socket connectors are mounted ABOVE an upper surface of a printed circuit board, such that it is inevitable to have a norm height which can not be compromised. Accordingly, it has been desired for a long time to have an ultra-low profile interconnection system so as to provide an ultra-thin electronic device.

Therefore, an improved electrical connector is required to overcome above problem.

SUMMARY OF THE INVENTION

An object of the present invention is to provide an electrical connector assembly having an electrical connector embedded inside a printed circuit board for reducing a height of the electrical connector assembly.

To achieve the aforementioned object, an electrical connector assembly comprises a printed circuit board defining at least an aperture with at least a conductive trace disposed therein and an electrical connector having at least one contact electrically interconnecting with the conductive trace.

To further achieve the aforementioned object, an electrical connector assembly comprises an insulative substrate, a bottom substrate mounted under the insulative substrate, and a plurality of contacts. The insulative substrate defines a plurality of passageways. The bottom substrate includes a plurality of vias communicating with the passageways and a plurality of conductive pads disposed on at least a top and a bottom surface thereof The plurality of contacts are disposed in the passageways and the vias.

Other objects, advantages and novel features of the invention will become more apparent from the following detailed description of a preferred embodiment when taken in conjunction with the accompanying drawings.

DETAILED DESCRIPTION OF THE INVENTION

Figure 1:
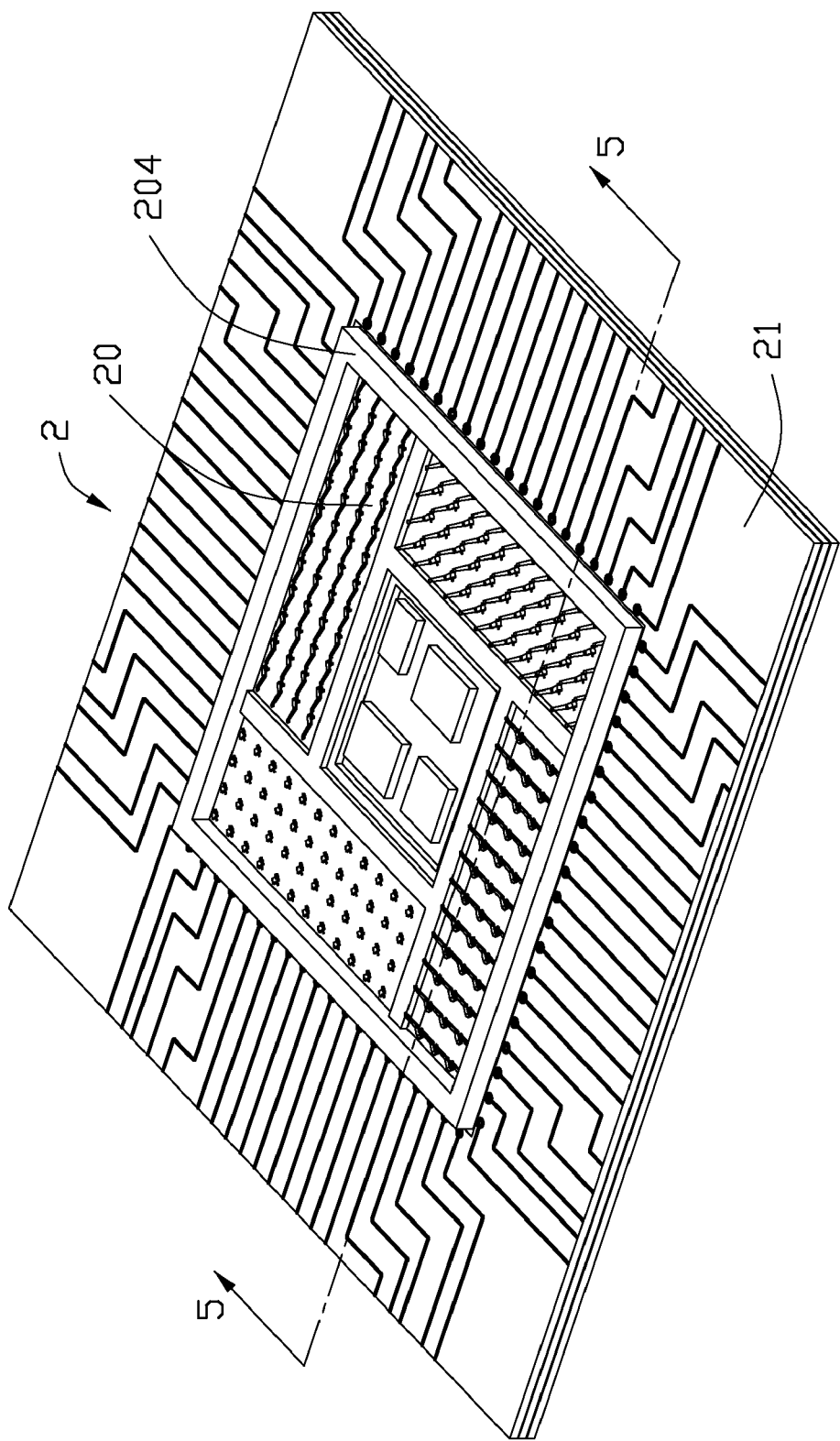
FIG. 1 is an assembled, perspective view of an electrical connector assembly in accordance with the present invention.

FIG. 1 shows an electrical connector assembly comprising an electrical connector 20 and a printed circuit board 21 receiving the electrical connector 20.

Figure 3:
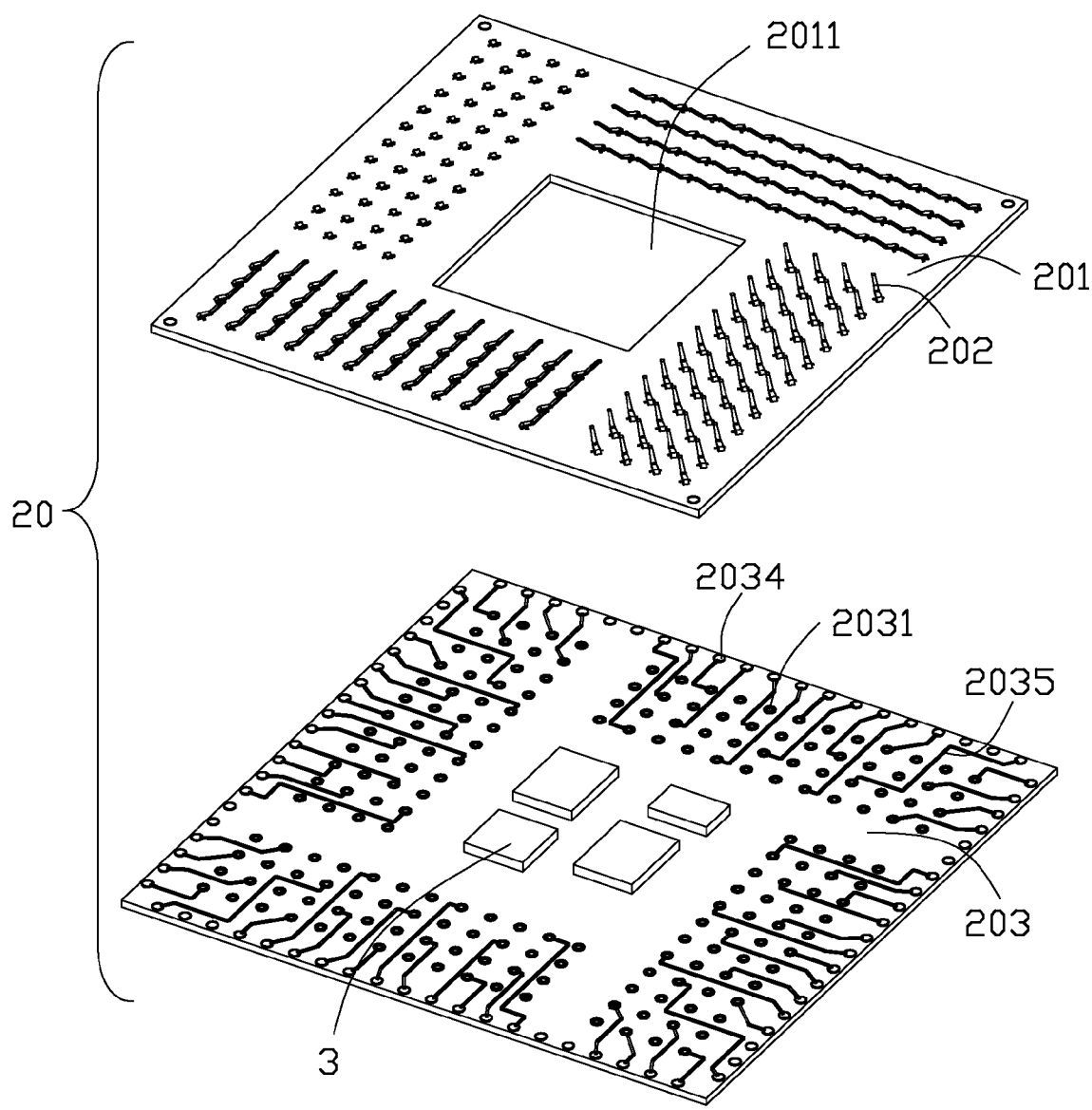
FIG. 3 is an exposed, perspective view of the electrical connector in accordance with the present invention.

Referring to FIG. 3, the electrical connector comprises an insulative substrate 201, a plurality of contacts 202, and a bottom substrate 203 positioned lower than the insulative substrate 201. The insulative substrate 201 and the second substrate 203 are formed with the same materials of the printed circuit board 21, such as glass fiber panel. The insulative substrate 201 defines an opening 2011 in the middle thereof and a plurality of passageways (not labeled) surrounding of the opening 2011. The contacts 202 are retained in the passageways (not labeled), and each has a tail portion 2021 extending beyond a bottom surface of the insulative substrate 201 and a mating portion 2022 extending beyond a top surface of the insulative substrate 201. In this embodiment of the present invention, the passageways 2012 are arranged in four sets and the mating portions 2022 of the contacts 202 located in each set aslant faces toward the opening 2011, so as to minimize or eliminate tangential component forces between the opposite sets when an electronic package (not shown) is assembled on the electrical connector 20.

Figure 4:
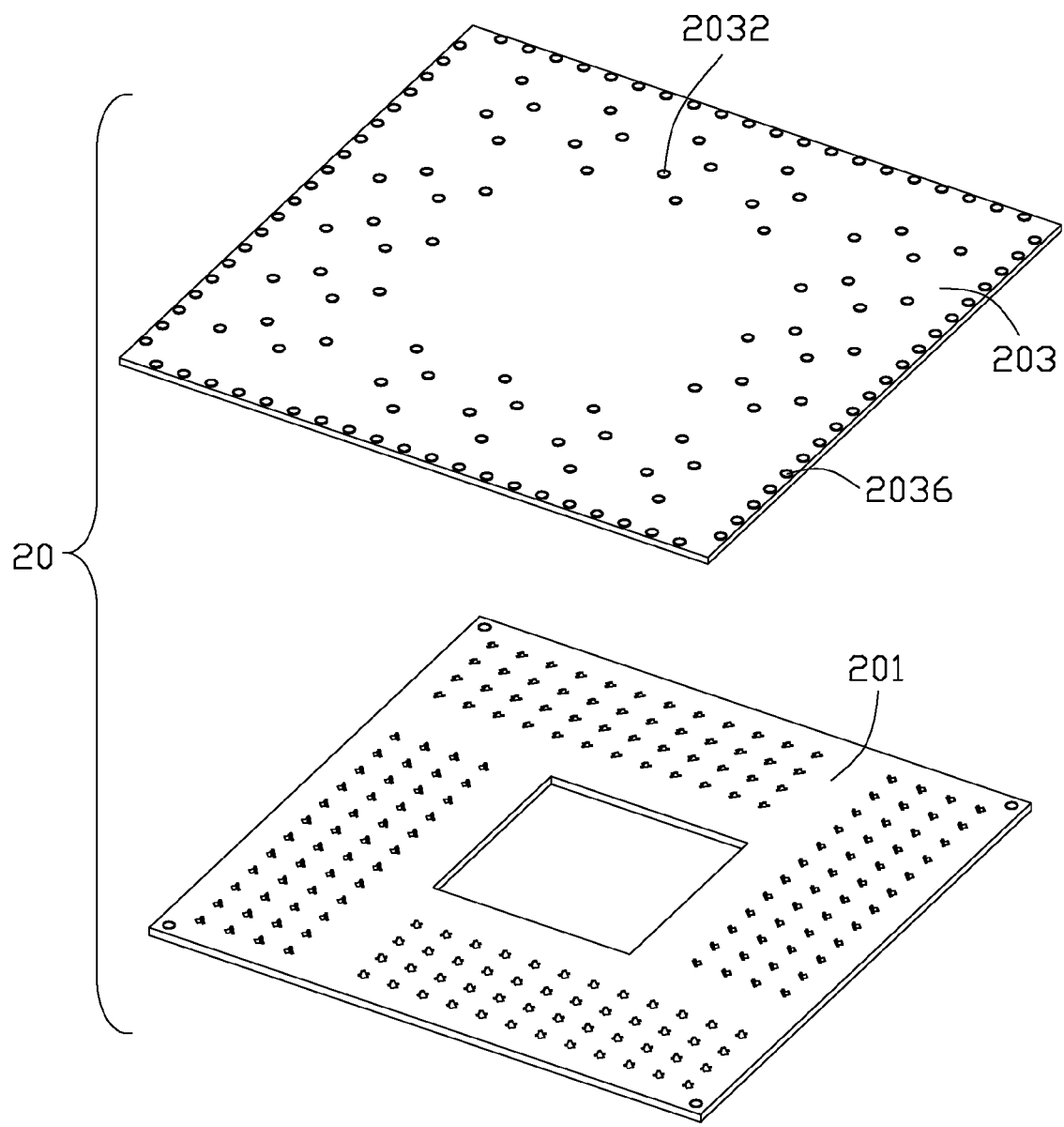
FIG. 4 is similar with the FIG. 3, but taken from another side.

Referring to FIG. 3 and FIG. 4, the bottom substrate 203 has a similar shape with the insulative substrate 201, but bigger than the insulative substrate 201, so as to form an edge portion 2033 at edges of the bottom substrate 203. The bottom substrate 203 defines a plurality of vias 2031 with copper or other metallic material inner sidewalls of the passageways 2012. The vias 2031 are not through holes. The edge portion 2033 has a plurality of pads 2034 located on the top thereof and a plurality of conductors 2036 located on the bottom thereof and corresponding to the pads 2034, but without electrical connecting with the pads 2034. Some of the pads 2034 electrically connect with the vias 2031 by traces 2035 disposed on a top surface of the bottom substrate 203, and some of the conductors 2036 electrically connect with the another vias 2031 by traces 2037 disposed inside of the bottom substrate 203. The principle of the traces 2035, 2037 disposed on the bottom substrate 203 is same with that of the printed circuit board 21. The bottom surface of the bottom substrate 203 has a plurality of soldering pads 2032 which is less than the vias 2031. A plurality of electrical elements 3, such as sensor elements, are mounted on the bottom substrate 203 and exposed in the opening 2011 of the insulative substrate 201 to achieve various function.

Figure 5:
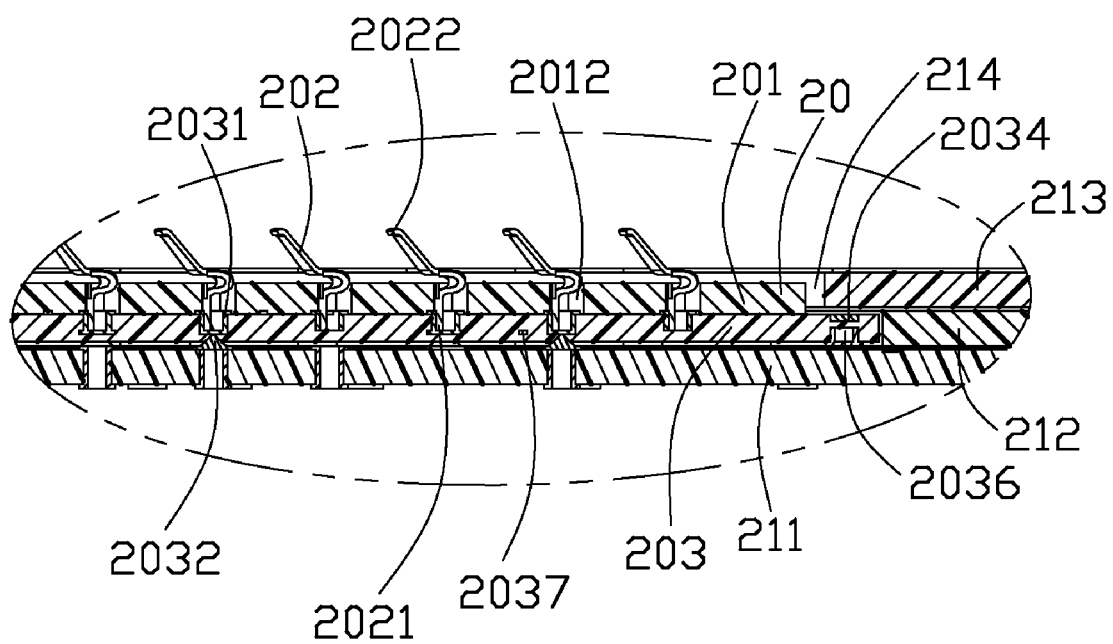
FIG. 5 is a partial cross-sectional view taken along line 5-5 of FIG. 1.

Referring to FIG. 3-5, in the present invention, the tail portions 2021 of contacts 202 are soldered to the vias 2031 of the bottom substrate 203 and electrically connect with the printed circuit board 21 in three ways. In the first way, some contacts 202 in the vias 2031 electrically connect with the printed circuit board 21 by soldering pads 2032 located on the bottom substrate 203. In the second way, some contacts 202 in another vias 2031 connect with the pads 2034 of the edge portion 2033 by traces 2035, and the pads 2034 are further electrically connected with the printed circuit board 21. In the third way, the rest contacts 202 in the rest vias 2031 connect with the conductors 2036 of the edge portion 2033 by traces 2037, and the conductors 2036 are electrically connected with the printed circuit board 21.

Figure 2:
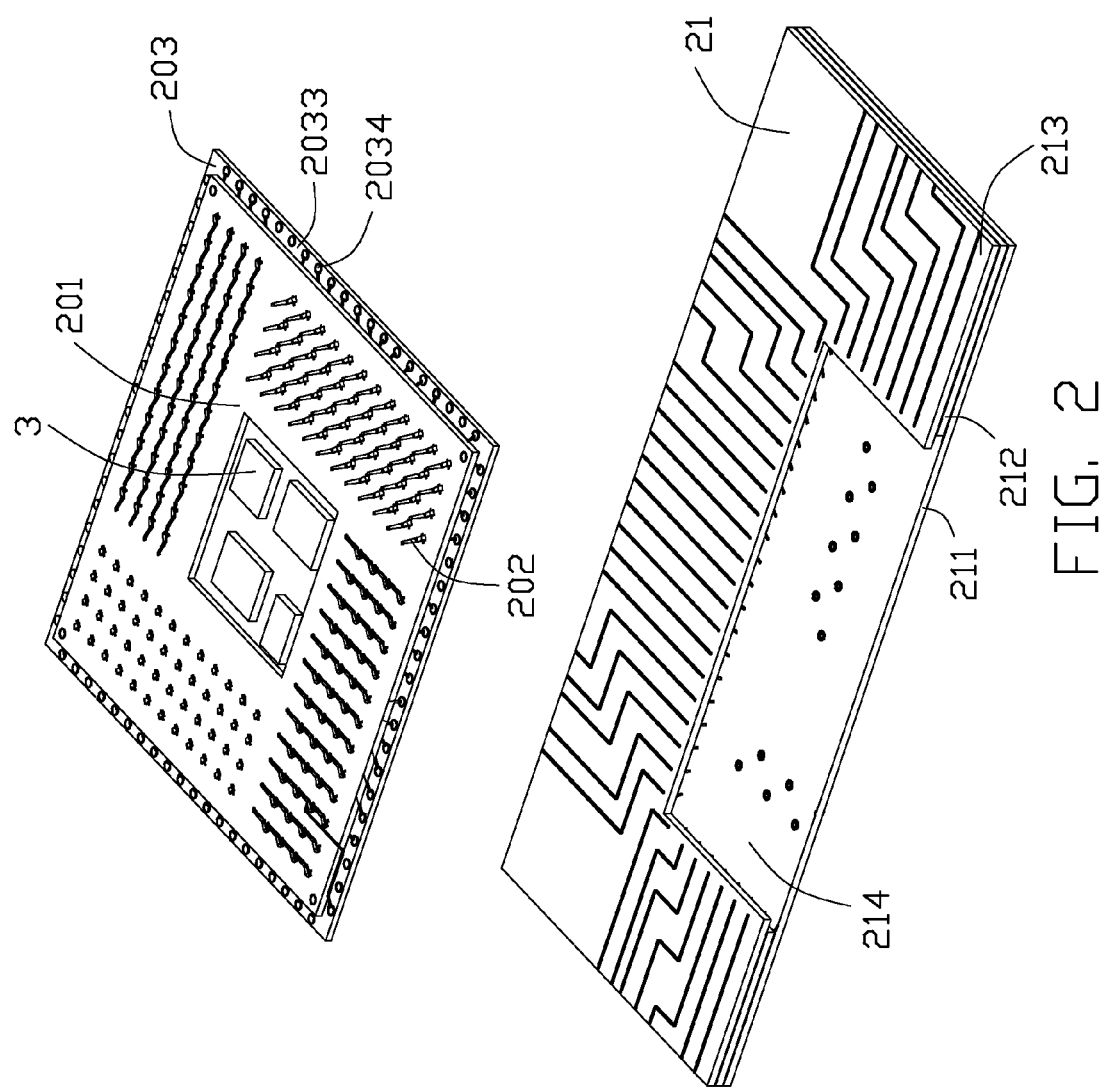
FIG. 2 is a partially exposed, perspective view of the electrical connector assembly, showing a part of a printed circuit board.

Referring to FIG. 2, the printed circuit board 21 includes a number of insulative fiber boards. For example, three-ply board can be seen in the present embodiment. The printed circuit board 21 comprises a first insulative board 211 at a bottom thereof, a second board 212 at a middle thereof, and a third board 213 at a top thereof The second and the third boards 212, 213 cooperatively define an aperture 214. The aperture 214 has configuration corresponding to the insulative substrate 201 and the bottom substrate 203 and is used to receive the insulative substrate 201 and the bottom substrate 203. Understandably, the aperture 214 is smaller at top thereof and bigger at bottom thereof.

Referring to FIG. 5, the assembly process of the electrical connector assembly 2 is as follows: the first and the second boards 211, 212 of the printed circuit board 21 are assembled together; then the electrical connector 20 is put into the aperture 214 of the second board 212; at last the third board 213 is assembled upon the second board 212. In this arrangement, the pads 2034 of the edge portion 2033 of the bottom substrate 203 electrically connect with the third board 213, the conductors 2036 of the edge portion 2033 of the bottom substrate 203 electrically connect with first board 211. The electrical connector 20 is embedded inside of the aperture 214, and a frame 204 is mounted and surrounds the electrical connector 20 to orientate the electronic package (not shown).

In the present invention, the bottom substrate 203 may integrally formed with the insulative substrate 201 and can have the same configuration with the insulative substrate 201. The bottom substrate 203 also can be eliminated in according to the detail practice. The contacts 202 connect to the printed circuit board 21 in three ways in the present embodiment, but is not limited thereto, people can choose various ways to connect the contacts 202 to the printed circuit board 21. The printed circuit board 21 can have more than or less than three insulative boards.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector assembly comprising:
a printed circuit board defining at least an aperture with at least a conductive trace disposed therein; and
an electrical connector seating into the aperture and having at least one contact electrically interconnecting with the conductive trace; wherein the electrical connector comprises an insulative substrate receiving the contacts, and the insulative substrate is made by a similar material of the printed circuit board; wherein the electrical connector further comprises a bottom substrate located under the insulative substrate, and the bottom substrate is made by the similar material of the printed circuit board; wherein the insulative substrate defines a plurality of passageways and the bottom substrate defines corresponding vias to cooperatively receive the contacts, which are electrically connected with the vias; wherein the bottom substrate is bigger than the insulative substrate to form an edge portion; wherein the edge portion has a plurality of pads located on a top surface thereof and a plurality corresponding conductors located on a bottom surface thereof; wherein some of the vias connect with the soldering pads, another vias connect with the pads of the edge portion by traces located on the top surface of the bottom substrate, the rest vias connect with the conductors by traces located inside the bottom substrate; wherein the printed circuit board includes a plurality of insulative boards, and the aperture of the printed circuit board is defined on an upper layer or upper layers of the insulative boards and has a shape corresponding to the electrical connector, the aperture has a big upper section and small lower section.

2. The electrical connector assembly as claimed in claim 1, wherein the bottom substrate has a plurality of soldering pads at a bottom surface thereof, the soldering pads electrically connect with the vias to the printed circuit board.

3. The electrical connector assembly as claimed in claim 2, wherein the number of the soldering pads is less than the vias.

4. The electrical connector assembly as claimed in claim 1, wherein a frame surrounds and is mounted upon the electrical connector.

5. The electrical connector assembly as claimed in claim 1, wherein the insulative substrate is integrally formed with the bottom substrate.

6. An electrical connector assembly comprising:
an insulative substrate defining a plurality of passageways;
a bottom substrate mounted under the insulative substrate, including a plurality of vias communicating with the passageways and a plurality of conductive pads disposed on at least a top and a bottom surface thereof; and
a plurality of contacts disposed in the passageways and the vias; a printed circuit board has a plurality of insulative boards, and an upper layer or upper layers of the insulative boards defines an aperture to receive the insulative substrate and the bottom substrate; wherein the bottom substrate has an edge portion extending beyond edges of the insulative substrate, the edge portion includes a plurality of pads on a top surface and a plurality of corresponding conductors on a bottom surface, and the bottom surface further has a plurality of soldering pads corresponding to the vias and less than the vias; wherein some contacts in the vias electrically connect with the printed circuit board by soldering pads, some contacts in another vias connect with the pads by traces located on the top surface of the bottom substrate, and the pads are further electrically connected with the printed circuit board, the rest contacts in the rest vias connect with the conductors by traces located inside the bottom substrate, and the conductors are electrically connected with the printed circuit board.

7. An electrical connector assembly comprising:
a multi-layer board structure defining a connector area around a center with a recess therein; and
an electrical connector device disposed in the recess and including a plurality of resilient contacts essentially located in corresponding vias with contacting sections extending upwardly beyond a top face of the connector device, a plurality of conductive pads formed on a periphery of the connector device; wherein
some of the contacts are electrically connected to the multi-layer board structure by the corresponding conductive pads under condition that for each of said some of the contacts a transversely extending conductive trace is connected between the corresponding via and the corresponding conductive pad; wherein others of said contacts are electrically connected to the multi-layer board structure by corresponding soldering pads which are embedded within the multi-layer board structure under the recess and essentially located right under the contacts in a vertical direction, respectively.

8. The electrical connector assembly as claimed in claim 7, wherein said connector device essentially includes an upper plate and a lower plate stacked with each other, and said conductive pads are essentially formed between an interface of said upper plate and said lower plate in a vertical direction.

9. The electrical connector assembly as claimed in claim 7, wherein said connector device essentially includes an upper plate and a lower plate stacked with each other, and said conductive pads are essentially embedded within the lower plate.

* * * * *